(12) United States Patent
Lim et al.

(10) Patent No.: US 12,206,383 B2
(45) Date of Patent: Jan. 21, 2025

(54) DUAL-BAND 360 DEGREE PHASE SHIFTER USING SERIES/PARALLEL RESONANCE CIRCUIT FOR PHASED ARRAY ANTENNA SYSTEM

(71) Applicant: ELECTRONICS AND TELECOMMUNICATIONS RESEARCH INSTITUTE, Daejeon (KR)

(72) Inventors: Jun Han Lim, Daejeon (KR); Seong Mo Moon, Daejeon (KR); Jin Sek Park, Daejeon (KR); Dong Pil Chang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 238 days.

(21) Appl. No.: 17/945,212

(22) Filed: Sep. 15, 2022

(65) Prior Publication Data

US 2023/0216468 A1    Jul. 6, 2023

(30) Foreign Application Priority Data

Dec. 30, 2021    (KR) .......................... 10-2021-0192319

(51) Int. Cl.
    *H03H 7/21*    (2006.01)
    *H03H 7/18*    (2006.01)

(52) U.S. Cl.
    CPC ................ *H03H 7/18* (2013.01); *H03H 7/21* (2013.01)

(58) Field of Classification Search
    CPC    H03H 7/18; H03H 7/21; H03H 7/185; H03H 7/19; H03H 7/20; H03H 7/30; H03H 7/32; H03H 11/16; H03H 11/18; H03H 11/20; H03H 11/22; H01P 1/18
    See application file for complete search history.

(56) References Cited

U.S. PATENT DOCUMENTS

| 8,552,782 | B1 | 10/2013 | Trueheart et al. |
| 8,885,768 | B2 | 11/2014 | Yang et al. |
| 2020/0162033 | A1 | 5/2020 | Jang et al. |
| 2020/0204160 | A1 | 6/2020 | Lim et al. |

OTHER PUBLICATIONS

Sang Young Kim et al., "An Improved Wideband All-Pass I/Q Network for Millimeter-Wave Phase Shifters", IEEE Transactions On Microwave Theory and Techniques, vol. 60, No. 11, Nov. 2012.

*Primary Examiner* — Stephen E. Jones
(74) *Attorney, Agent, or Firm* — LRK PATENT LAW FIRM

(57) ABSTRACT

Disclosed is a dual-band phase shifter in which series/parallel resonance circuits are applied to a polyphase filter to implement a phase shifter, which is a core block of a multi-channel RFIC for implementing a phased array antenna system. The dual-band phase shifter may be configured by converting a capacitor (C) of an LC circuit or a CL circuit in the RFIC into a series resonance circuit and converting an inductor (L) thereof into a parallel resonance circuit, so that a signal generator operating in one frequency band can operate in a dual-band.

2 Claims, 16 Drawing Sheets

DUAL-BAND 360 DEGREE PHASE SHIFTER USING SERIES/PARALLEL RESONANCE CIRCUIT FOR PHASED ARRAY ANTENNA SYSTEM

CROSS-REFERENCE TO RELATED APPLICATION(S)

This application claims priority to Korean Patent Application No. 10-2021-0192319, filed on Dec. 30, 2021, with the Korean Intellectual Property Office (KIPO), the entire contents of which are hereby incorporated by reference.

BACKGROUND

1. Technical Field

Exemplary embodiments of the present disclosure relate in general to a dual-band degree phase shifter in which a series/parallel resonance circuit is applied to a polyphase filter, as one method for implementing a phase shifter, which is a block of a core multi-channel RFIC to realize a phase array antenna system.

2. Description of Related Art

At present, research and development on wireless application systems such as satellite communication, earth observation, remote sensing, and multifunctional radar are steadily progressing. These application systems generally require multiple bands and various polarization functions for the system. Furthermore, multi-band operation can increase system versatility, which can significantly reduce the potential cost of required components.

Specifically, in a multi-channel radio frequency integrated circuit (RFIC), since the size of chips needs to be formed smaller than an array of antenna single elements, a very important performance index in design is reducing the size of circuits while simultaneously realizing multiple bands.

FIG. 1 illustrates a basic configuration of a conventional phase shifter. The conventional phase shifter is composed of an I/Q generator that divides an input signal of differential phases into quadrature phases, an analog differential adder that selects a specific phase from the quadrature signals generated from the I/Q generator and combines the selected signals, and a 50-ohm matching circuit for output matching. The output has any one of 16-state phases.

In FIG. 1, the analog differential adder does not have a large limitation on the frequency because it has a wideband operating frequency, but a polyphase filter, which is an I/Q generator, has a large limitation on the bandwidth of phase and amplitude at the operating frequency according to a structure or an implementation method. General I/Q generators have been developed with techniques applying a polyphase filter technique in which a transmission line is implemented and integrated as a lumped component.

In order to obtain wideband characteristics, in the related art, a method of obtaining wideband characteristics by applying a signal generation scheme such as an RC-CR polyphase filter has been proposed. However, there is a limitation to a structure in which the amplitude varies depending on the shape and only the phase generates in a wide band in a full band, or the phase is correct only at a specific frequency and only the amplitude operates in a wide band in the full band.

In order to improve the aforementioned limitations, there are also proposed structures of allowing the amplitude and phase to be simultaneously wideband depending on the frequency by connecting a polyphase filter in multiple stages. However, such structures have the disadvantage of increased insertion loss.

In order to overcome the limitations and disadvantages, in the related art, a method of reducing loss by applying an LC-CL I/Q polyphase filter scheme has been proposed. However, this structure cannot be used in a dual-band because the operating range thereof is determined according to frequency.

In addition, most conventional technologies extend the range of the operating frequency by applying a method of changing a capacitor or resistor to obtain dual-band characteristics, and through this, dual-band operation is implemented. However, a disadvantage of this approach is that a change in the band can be achieved only through control.

SUMMARY

Accordingly, exemplary embodiments of the present disclosure are provided to substantially obviate one or more problems due to limitations and disadvantages of the related art.

Exemplary embodiments of the present disclosure provide a dual-band phase shifter that can be used as one of core parts of beam-steering systems, such as a phased-array antenna systems, and control the operation and performance of a capacitor and an inductor for dual-band in an integrated circuit itself.

Exemplary embodiments of the present disclosure also provide a dual-band phase shifter configured to operate in dual bands by changing a capacitor C of an LC circuit or a CL circuit in a radio frequency integrated circuit (RFIC) to a series resonance circuit and changing an inductor L to a parallel resonance circuit to operate a signal generator operating in one frequency band in dual bands.

According to a first exemplary embodiment of the present disclosure, provided is a dual-band phase shifter wherein a series resonance circuit of an LC circuit or a CL circuit may be converted to replace a capacitor (C) in a dual-band phase shifter of a phased array antenna system; and wherein a parallel resonance circuit of the LC circuit or the CL circuit may be converted to replace an inductor (L) in the dual-band phase shifter of the phased array antenna system.

According to a second exemplary embodiment of the present disclosure, provided is a dual-band phase shifter wherein a first terminal of a first capacitor (C1), a first terminal of a first inductor (L1), and a first terminal of a first resistor (R1) are commonly connected to a first input (Ip), a first terminal of a third inductor (L3), a first terminal of a third capacitor (C3), and a first terminal of a fourth resistor (R4) are commonly connected to a second input (In), a second terminal of the first resistor (R1), a second terminal of a second capacitor (C2), and a second terminal of a second inductor (L2) are commonly connected to a first output (OIp), a second terminal of the fourth resistor (R4), a second terminal of a fourth inductor (L4), and a second terminal of a fourth capacitor (C4) are commonly connected to a second output (OIn), a second terminal of the first capacitor (C1), a second terminal of the third inductor (L3), and a second terminal of a third resistor (R3) are commonly connected to a third output (OQp), a second terminal of the first inductor (L1), a second terminal of the third capacitor (C3), and a second terminal of a second resistor (R2) are commonly connected to a fourth output (OQn), a first terminal of the third resistor (R3) is commonly connected to a first terminal of the second inductor (L2) and a first terminal of the fourth capacitor (C4), and a first terminal of the second resistor (R2) is commonly connected to a first terminal of the second capacitor (C2) and a first terminal of the fourth inductor (L4).

The dual-band phase shifter may have a structure in which the first capacitor (C1) is changed to a series resonance circuit of a first capacitor (C11) and a second inductor (L12), the first inductor (L1) is changed to a parallel resonance circuit of a second capacitor (C12) and a first inductor (L11), the second capacitor (C2) is changed to a series resonance circuit of a third capacitor (C21) and a fourth inductor (L22), and the second inductor (L2) is changed to a parallel resonance circuit of a fourth capacitor (C22) and a third inductor (L21).

The dual-band phase shifter may have a structure in which the third inductor (L3) is changed to a parallel resonance circuit of a sixth capacitor (C32) and a fifth inductor (L31), the third capacitor (C3) is changed to a series resonance circuit of a fifth capacitor (C31) and a sixth inductor (L32), the fourth inductor (L4) is changed to a parallel resonance circuit of an eighth capacitor (C42) and a seventh inductor (L41), and the fourth capacitor (C4) is changed to a series resonance circuit of a seventh capacitor (C41) and an eighth inductor (L42).

The first to fourth capacitors (C1 to C4), the first to fourth inductors (L1 to L4), and the first to fourth resistors (R1 to R4) may be mounted in a radio frequency integrated circuit (RFIC).

The dual-band phase shifter may be used in a phased array antenna system or a polyphase filter.

According to the present disclosure, dual-band characteristics can be simultaneously implemented in one integrated circuit, and even a frequency band that cannot be achieved in an existing wideband structure can also be implemented with an I/Q signal and a 360-degree phase shifter.

In addition, according to the present disclosure, a capacitor and an inductor used in all polyphase filters implemented as an integrated circuit or a lump can be changed to a series resonance circuit and a parallel resonance circuit in the order described, respectively, and can be applied to all polyphase filters by applying values of Equations (1) to (3).

DETAILED DESCRIPTION OF THE EMBODIMENTS

Figure 1:
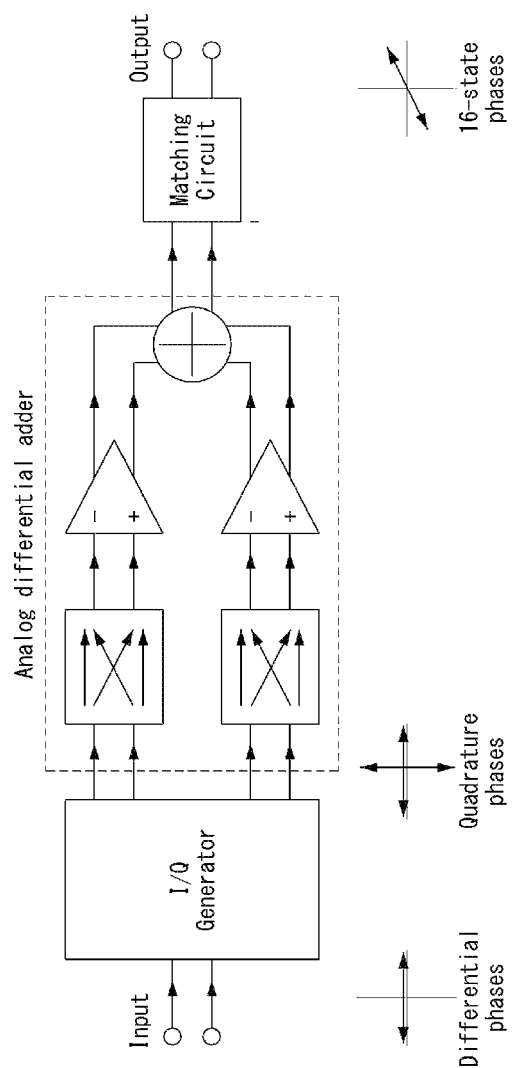
FIG. 1 illustrates a basic configuration of a conventional phase shifter.
Figure 2A:
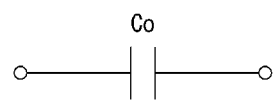
FIGS. 2A to 2D are views for describing a basic structure of a resonance circuit of an I/Q quadrature signal generator based on an LC/CL polyphase filter that may be adopted in a dual-band phase shifter according to one embodiment of the present disclosure.
Figure 2B:
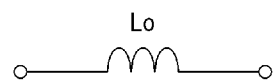
Figure 2C:
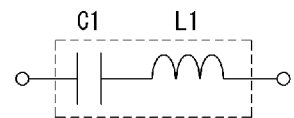
Figure 2D:
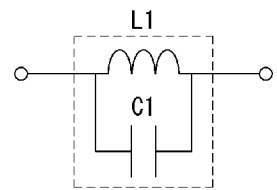
Figure 3A:
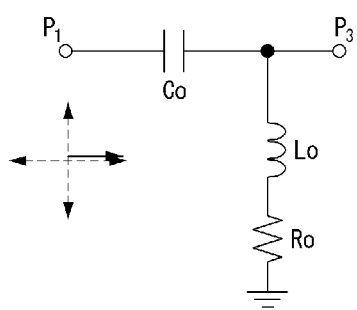
FIGS. 3A to 3D are views for describing a polyphase filter-based orthogonal signal generator that may be adopted in the dual-band phase shifter according to one embodiment of the present disclosure and an operating principle thereof.
Figure 3B:
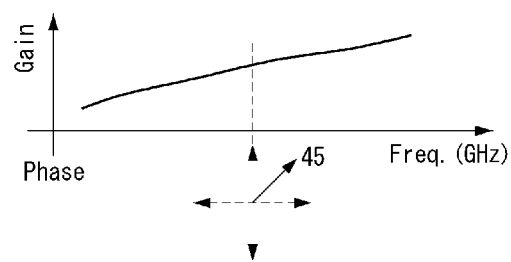
Figure 3C:
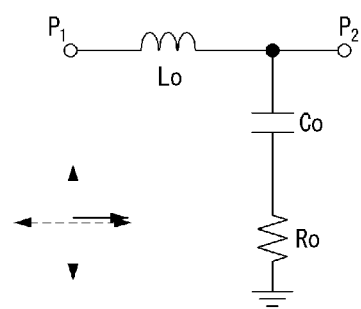
Figure 3D:
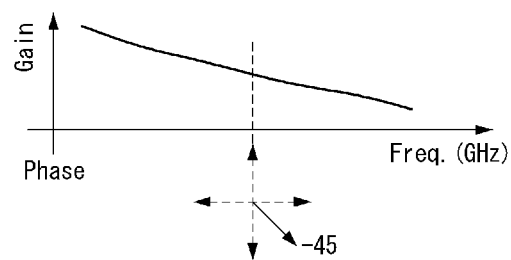

Exemplary embodiments of the present disclosure are disclosed herein. However, specific structural and functional details disclosed herein are merely representative for purposes of describing exemplary embodiments of the present disclosure. Thus, exemplary embodiments of the present disclosure may be embodied in many alternate forms and should not be construed as limited to exemplary embodiments of the present disclosure set forth herein.

Accordingly, while the present disclosure is capable of various modifications and alternative forms, specific exemplary embodiments thereof are shown by way of example in the drawings and will herein be described in detail. It should be understood, however, that there is no intent to limit the present disclosure to the particular forms disclosed, but on the contrary, the present disclosure is to cover all modifications, equivalents, and alternatives falling within the spirit and scope of the present disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

In exemplary embodiments of the present disclosure, "at least one of A and B" may refer to "at least one of A or B" or "at least one of combinations of one or more of A and B". In addition, "one or more of A and B" may refer to "one or more of A or B" or "one or more of combinations of one or more of A and B".

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular exemplary embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present disclosure will be described in greater detail with reference to the accompanying drawings. In order to facilitate general understanding in describing the present disclosure, the same components in the drawings are denoted with the same reference signs, and repeated description thereof will be omitted.

An orthogonal signal is generated based on the way of generating phase signals of +45 degrees and −45 degrees, respectively, between P2 and P3 based on an input P1 in an LC/CL resonator, and splitting an orthogonal phase signal between output nodes.

FIGS. 2A to 2D are views for describing a basic structure of a resonance circuit of an I/Q quadrature signal generator based on an LC/CL polyphase filter that may be adopted in a dual-band phase shifter according to one embodiment of the present disclosure.

Referring to FIGS. 2A to 2D, most resonance circuits used in a polyphase filter inside the I/Q generator (see FIG. 1) include a capacitor $C_0$ and an inductor $L_0$. The present embodiment is based on changing the capacitor $C_0$ to a series resonance circuit of a first capacitor $C_1$ and a first inductor $L_1$, and changing the inductor $L_0$ to a parallel resonance circuit of the first capacitor $C_1$ and the first inductor $L_1$.

The basic configuration and operating principle of the orthogonal signal generator based on the LC/CL polyphase scheme are described in Related Art Document 1.

Meanwhile, in the structure of the existing polyphase filter, a phase is exactly 90 degrees only at one frequency and the amplitude occurs at the same frequency. This structure typically operates in a wide band and defines the operating range according to the specification of amplitude and phase errors.

In addition, in order to achieve wider band operation, the wide band operation may be implemented by controlling a capacitance with a variable capacitor in the structure of the existing polyphase filter. In this case, however, a decrease in an image rejection ratio (IRR) caused by insertion loss has to be tolerated.

Accordingly, in the present embodiment, without using the variable capacitor, a capacitor in the polyphase filter is changed to an LC series resonance circuit and an inductor in the polyphase filter is changed to an LC parallel resonance circuit. When this polyphase filter structure is used, a dual-band circuit is implemented without an additional control circuit.

FIGS. 3A to 3D are views for describing a polyphase filter-based orthogonal signal generator that may be adopted in the dual-band phase shifter according to one embodiment of the present disclosure and an operating principle thereof.

Referring to FIGS. 3A to 3D, the orthogonal signal generated inside the orthogonal signal generator is generated by generating phase signals of +45° and −45°, respectively, between P2 and P3 based on an input P1 in the LC/CL resonator and splitting an orthogonal phase signal between the output nodes.

Here, in order to change the capacitor $C_0$ to the LC series resonance circuit, a first terminal of the inductor $L_0$ may be connected to a second terminal of the capacitor $C_0$ in a structure in which the inductor $L_0$ is connected to the capacitor $C_0$ in parallel when viewed from an output terminal P3. A first terminal of the capacitor $C_0$ is connected to an input terminal P1, and a resistor $R_0$ may be disposed between a second terminal of the inductor L0 and the ground. In that case, the orthogonal signal generator may operate so that a phase of one of output nodes thereof has a +45° direction, as illustrated in a graph of expressing a gain at the frequency of a gigahertz (GHz) frequency band (see FIGS. 3A and 3B).

Similarly, in order to change the inductor $L_0$ to the LC parallel resonance circuit, the first terminal of the capacitor $C_0$ may be connected to the second terminal of the inductor $L_0$ in a structure in which the capacitor $C_0$ is connected to the inductor $L_0$ in parallel when viewed from an output terminal P2. The first terminal of the inductor $L_0$ is connected to the input terminal P1, and another resistor $R_0$ may be connected between the second terminal of the capacitor $C_0$ and the ground. In this case, the orthogonal signal generator may operate so that a phase of one of output nodes thereof has a −45° direction, as illustrated in a graph of expressing a gain at the frequency of the gigahertz (GHz) frequency band (see FIGS. 3C and 3D).

When a dual-band frequency required in this case is defined as $f_1$, $f_2$, and input/output load resistance is defined as $R_S$, $R_L$, a center frequency ($f_0$) can be calculated using Equations (1) to (3) below.

$$f_0 = \sqrt{f_1 \times f_2} \qquad \langle \text{Equation (1)} \rangle$$

$$C_1 = \frac{1 - \left(\frac{f_1}{f_0}\right)^2}{2\pi f_1 \times \sqrt{R_S \times R_L}} \qquad \langle \text{Equation (2)} \rangle$$

$$L_1 = \frac{1}{(2 \times \pi \times f_0)^2 \times C_1} \qquad \langle \text{Equation (3)} \rangle$$

When each of the values calculated by applying Equations (1) to (3) is applied to each of $C_1$, $L_1$, a dual-band polyphase filter may be implemented as illustrated in FIGS. 4A to 4D.

FIGS. 4A to 4D are views for describing a resonance circuit of the dual-band polyphase filter that may be adopted in the dual-band phase shifter according to one embodiment of the present disclosure and an operating principle thereof.

Figure 4A:
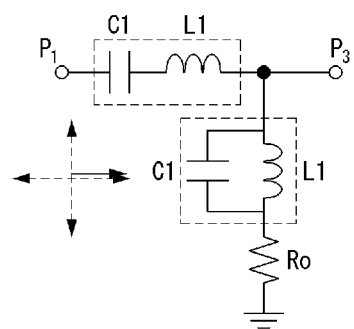
FIGS. 4A to 4D are views for describing a resonance circuit of the dual-band polyphase filter that may be adopted in the dual-band phase shifter according to one embodiment of the present disclosure and an operating principle thereof.
Figure 4B:
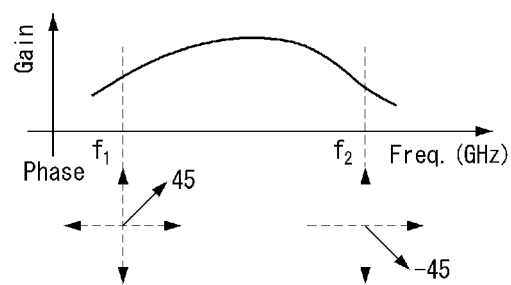

Referring to FIGS. 4A and 4B, the orthogonal signal generated inside the orthogonal signal generator may operate to generate dual-band phase signals of +45° and −45° between output nodes P3 based on an input of an input node P1 in the dual-band phase shifter circuit to sequentially output the orthogonal phase signals from the output node P3.

Herein, a series resonance circuit of the first capacitor $C_1$ and the first inductor $L_1$ may be connected at the position of the existing capacitor $C_0$, and a parallel resonance circuit of another first capacitor $C_1$ and another first inductor $L_1$ may be connected at the position of the existing inductor $L_0$.

According to such a structure, as illustrated in a graph curve of expressing a gain at the frequency of the gigahertz (GHz) frequency band, the orthogonal signal generator may operate to output a signal whose phase is in a +45° direction at a first frequency $f_1$ and a signal whose phase is in a −45° direction at a second frequency $f_2$.

Figure 4C:
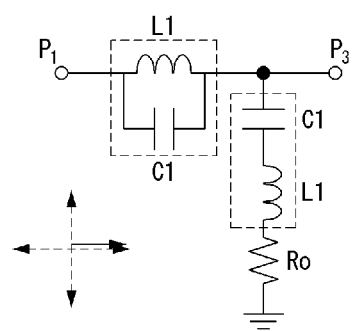
Figure 4D:
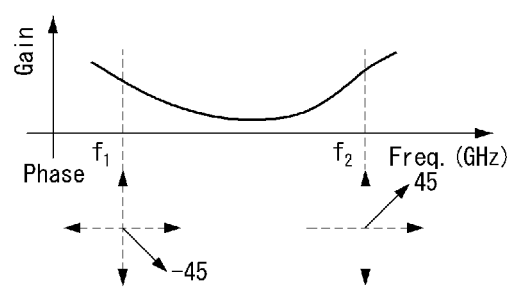

In addition, referring to FIGS. 4C and 4D, the orthogonal signal generated inside the orthogonal signal generator may operate to generate dual-band phase signals of −45° and +45° between output nodes P2 based on the input of the input node P1 in the dual-band phase shifter circuit to sequentially output the orthogonal phase signals in the output node P2.

Here, a parallel resonance circuit of the first capacitor $C_1$ and the first inductor $L_1$ may be connected at the position of the existing inductor $L_0$, and a series resonance circuit of another first capacitor $C_1$ and another first inductor $L_1$ may be connected at the position of the existing capacitor $C_0$.

According to such a structure, as illustrated by a graph curve of expressing a gain at the frequency of the gigahertz (GHz) frequency band, the orthogonal signal generator may operate to output a signal whose phase is in a −45° direction at the first frequency $f_1$ and a signal whose phase is in a +45° direction at the second frequency $f_2$.

Figure 5:
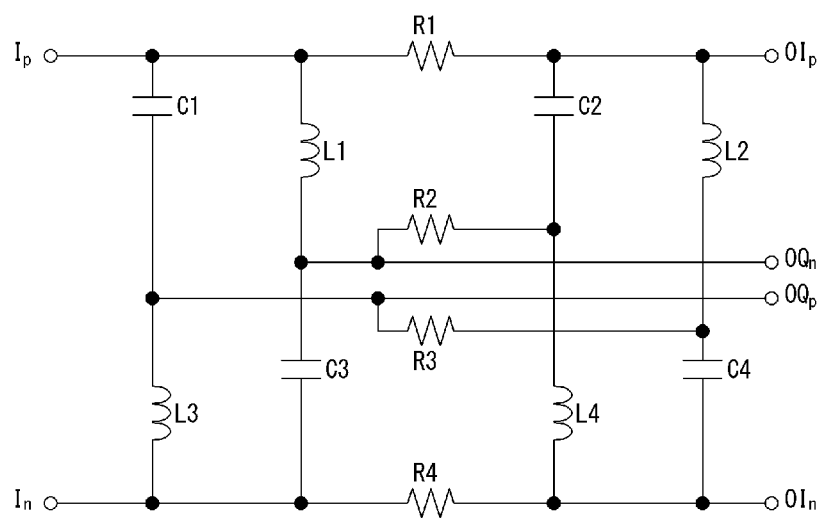
FIG. 5 is a circuit diagram of a polyphase filter with a 1.5-stage structure that may be adopted in the dual-band phase shifter according to one embodiment of the present disclosure.

FIG. 5 is a circuit diagram of a polyphase filter with a 1.5-stage structure that may be adopted in the dual-band phase shifter according to one embodiment of the present disclosure.

As illustrated in FIG. 5, the polyphase filter with the 1.5-stage structure of the present embodiment may include first to fourth capacitors C1 to C4, first to fourth inductors L1 to L4, first to fourth resistors R1 to R4, and a combination relationship thereof.

In more detail, in the circuit structure of the polyphase filter, a first terminal of the first capacitor C1, a first terminal of the first inductor L1 and a first terminal of the first resistor R1 are commonly connected to a first input Ip. A second terminal of the first resistor R1, a second terminal of the second capacitor C2 and a second terminal of the second inductor L2 are commonly connected to a first output OIp.

A first terminal of the third inductor L3, a first terminal of the third capacitor C3 and a first terminal of the fourth resistor R4 are commonly connected to a second input In. Furthermore, a second terminal of the fourth resistor R4, a second terminal of the fourth inductor L4, and a second terminal of the fourth capacitor C4 are commonly connected to a second output OIn.

A second terminal of the first capacitor C1, a second terminal of the third inductor L3, and a second terminal of the third resistor R3 are commonly connected to a third output OQp. A first terminal of the third resistor R3 is commonly connected to a first terminal of the second inductor L2 and a first terminal of the fourth capacitor C4.

A second terminal of the first inductor L1, the second terminal of the third capacitor C3, and the second terminal of the second resistor R2 are commonly connected to a fourth output OQn. A first terminal of the second resistor R2 is commonly connected to a first terminal of the second capacitor C2 and a first terminal of the fourth inductor L4.

When each value is optimized at a center frequency of 25 GHz in the polyphase filter described above, values of inductances L of each inductor, capacitances C of each capacitor, and resistance R of each resistor can be obtained.

Figure 6:
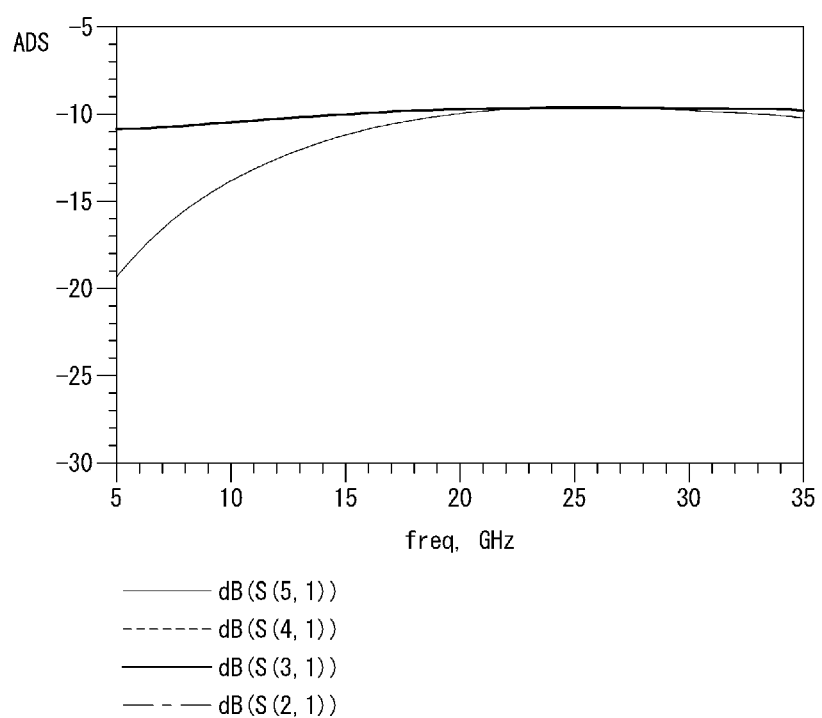
FIGS. 6 and 7 are graphs illustrating results of simulating gains and phase changes for each output using the values realized in the polyphase filter of FIG. 5.
Figure 7:
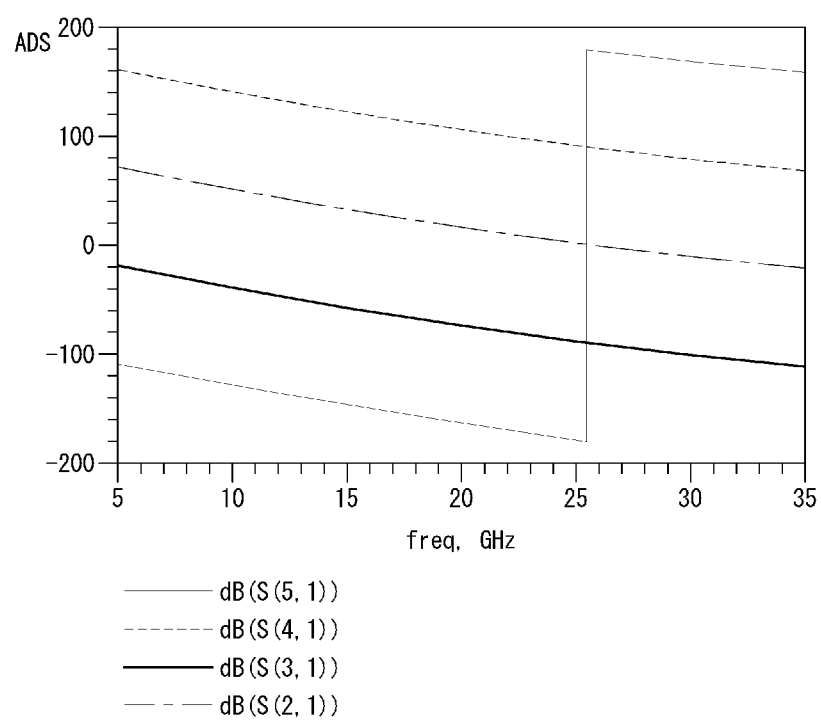
Figure 8:
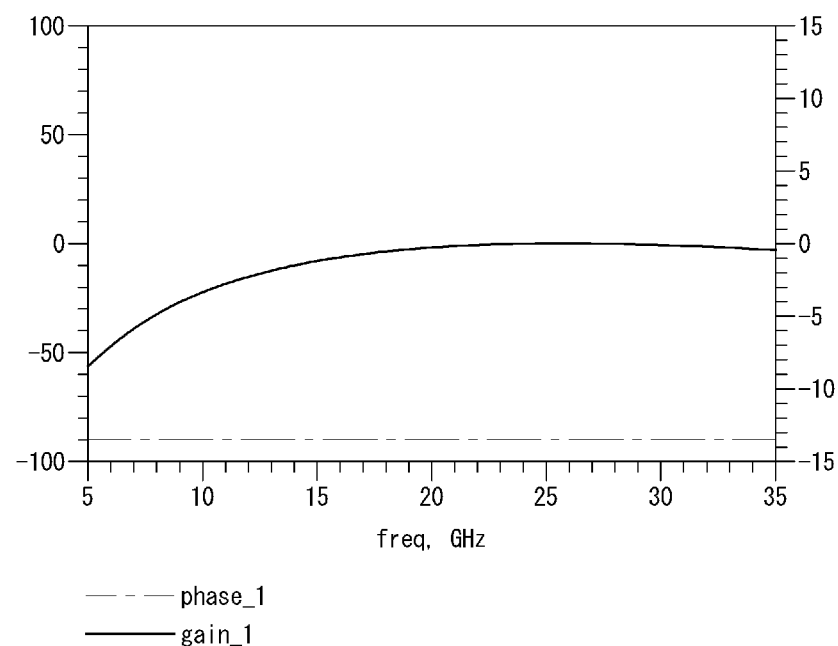
FIG. 8 is a graph illustrating a result of simulating a phase difference and a gain error between I/Q signals in the polyphase filter of FIG. 5.

FIGS. 6 and 7 are graphs illustrating results of simulating gains and phase changes for each output using the values realized in the polyphase filter of FIG. 5. FIG. 8 is a graph illustrating a result of simulating a phase difference and a gain error between I/Q signals in the polyphase filter of FIG. 5.

As can be seen from FIGS. 6 and 7, as a result of the simulation, it can be seen that each of the outputs of dB(S(5,1)), dB(S(4,1)), dB(S(3,1)) and dB(S(2,1)) operates normally in a band of 22 GHz to 31 GHz.

In addition, as can be seen from FIG. 8, it can be seen that a phase (phase_1) difference and a gain (gain_1) error between the I/Q signals are in a normal range.

Figure 9:
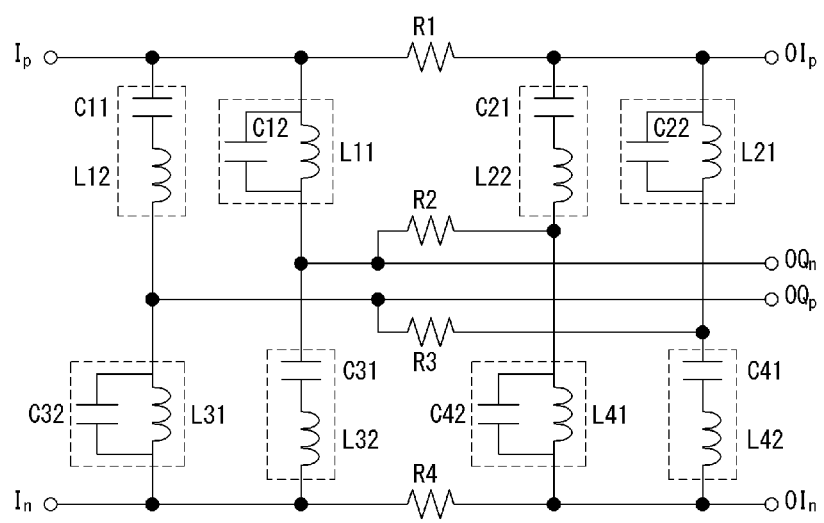
FIG. 9 is a circuit diagram of a dual-band polyphase filter that may be adopted in the dual-band phase shifter according to another embodiment of the present disclosure.

FIG. 9 is a circuit diagram of a dual-band polyphase filter that may be adopted in the dual-band phase shifter according to another embodiment of the present disclosure.

As illustrated in FIG. 9, the polyphase filter that may be adopted in the dual-band phase shifter of the present embodiment may include first to eighth capacitors C11, C12, C21, C22, C31, C32, C41 and C42, first to eighth inductors L11, L12, L21, L22, L31, L32, L41 and L42, and first to fourth resistors R1 to R4, and a combination relationship thereof.

When describing the combination relationship between the components of the polyphase filter in more detail, based on the polyphase filter of FIG. 5, the first capacitor C1 of FIG. 5 is changed to a series resonance circuit of the first capacitor C11 and the second inductor L12, the first inductor L1 of FIG. 5 is changed to a parallel resonance circuit of the second capacitor C12 and the first inductor L11, the second capacitor C2 of FIG. 5 is changed to a series resonance circuit of the third capacitor C21 and the fourth inductor L22, and the second inductor L2 of FIG. 5 is changed to a parallel resonance circuit of the fourth capacitor C22 and the third inductor L21.

In addition, based on the polyphase filter of FIG. 5, the third inductor L3 of FIG. 5 is changed to a parallel resonance circuit of the sixth capacitor C32 and the fifth inductor L31, the third capacitor C3 of FIG. 5 is changed to a series resonance circuit of the fifth capacitor C31 and the sixth inductor L32, the fourth inductor L4 of FIG. 5 is changed to a parallel resonance circuit of the eighth capacitor C42 and the seventh inductor L41, and the fourth capacitor C4 of FIG. 5 is changed to a series resonance circuit of the seventh capacitor C41 and the eighth inductor L42.

In addition, the combination relationship between a first input $I_p$ and a second input $I_n$, the resistors R1 to R4 and first to fourth outputs $OI_p$, $OI_n$, $OQ_p$ and $OQ_n$ may be substantially the same as that of the polyphase filter of FIG. 5.

Figure 10:
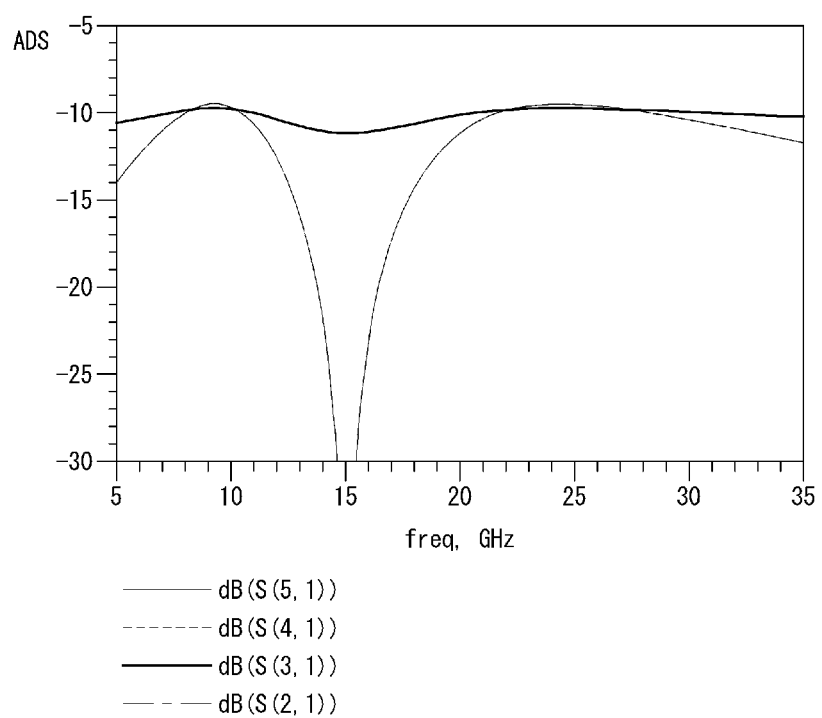
FIGS. 10 and 11 are graphs illustrating results of simulating gains and phase changes for each output using the values obtained in the polyphase filter of FIG. 9.
Figure 11:
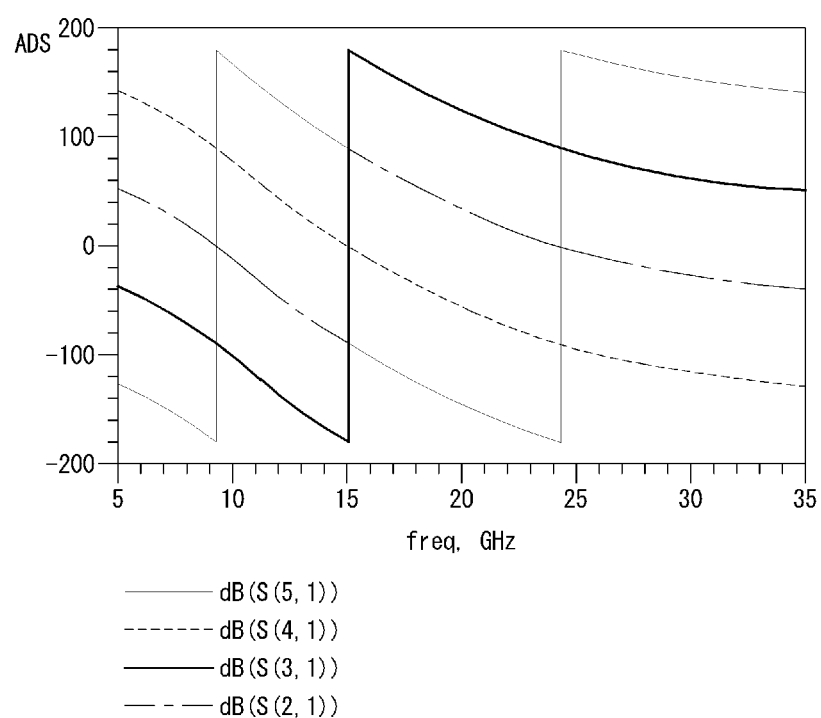
Figure 12:
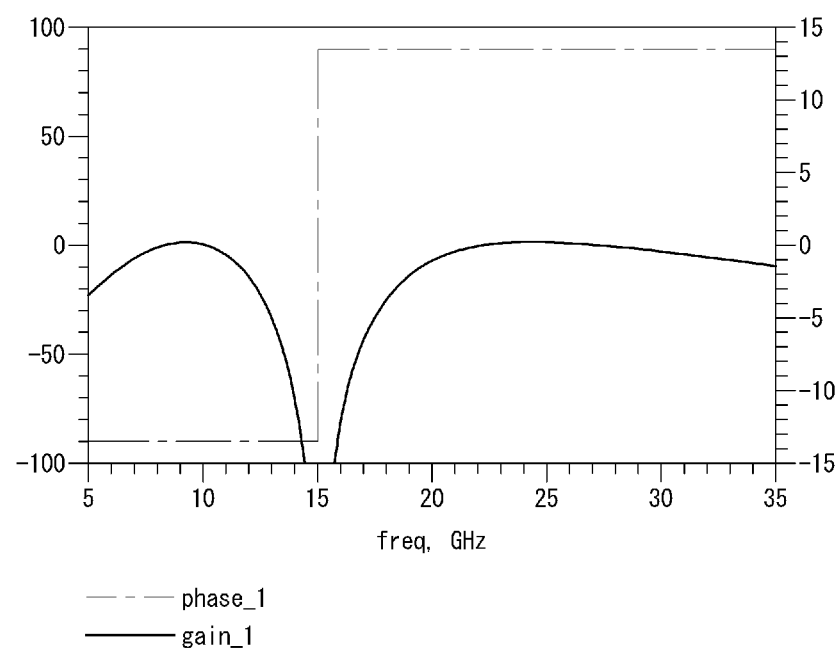
FIG. 12 is a graph illustrating a result of simulating a phase difference and a gain error between I/Q signals in the full frequency band of the polyphase filter of FIG. 9.

FIGS. 10 and 11 are graphs illustrating results of simulating gains and phase changes for each output using the values obtained in the polyphase filter of FIG. 9. FIG. 12 is a graph illustrating a result of simulating a phase difference and a gain error between I/Q signals in the full frequency band of the polyphase filter of FIG. 9.

As can be seen from FIGS. 10 and 11, as a result of the simulation, it can be seen that each of the outputs of dB(S(5,1)), dB(S(4,1)), dB(S(3,1)) and dB(S(2,1)) operates normally in two bands, i.e., a low frequency band of 8 GHz to 11 GHz and a high frequency band of 21 GHz to 29 GHz, based on a center frequency of 15 GHz.

In addition, as can be seen from the simulation results of FIG. 12, it can be seen that, in the full frequency band, the phase (phase_1) difference and the gain (gain_1) error between the I/Q signals are in a normal range.

Meanwhile, the structure according to the present embodiment has a disadvantage in that the phases of the I/Q signals operating in the dual bands which are two frequency bands, are changed. However, since it is known that the phase varies depending on the band used by the signal processing stage, it can be easily corrected via a digital stage or a lookup table (LUT).

As described above, the present embodiment can provide a dual-band phase shifter that is applicable to a multi-channel RFIC of a phase array system.

Figure 13:
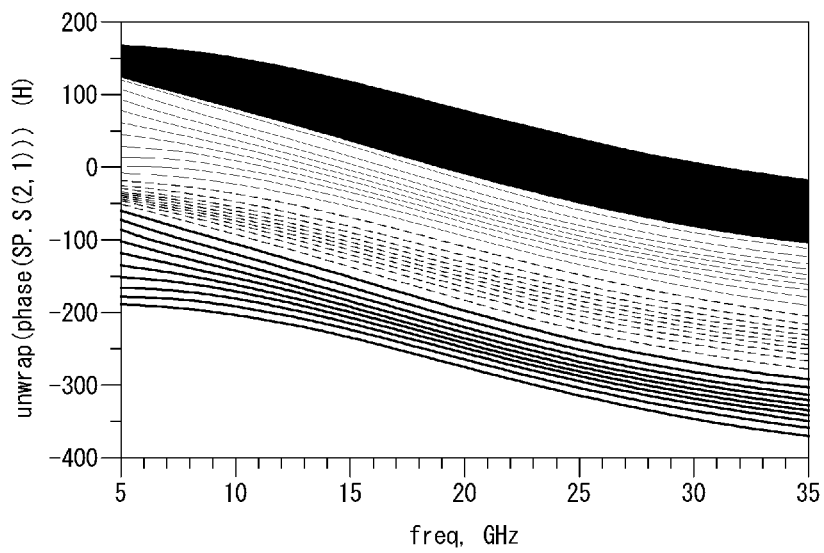
FIG. 13 is a graph illustrating a result of simulating whether a phase shifter of the comparative example with the existing structure including the analog differential adder and a matching circuit of FIG. 1 is shifted to a 360-degree phase.
Figure 14:
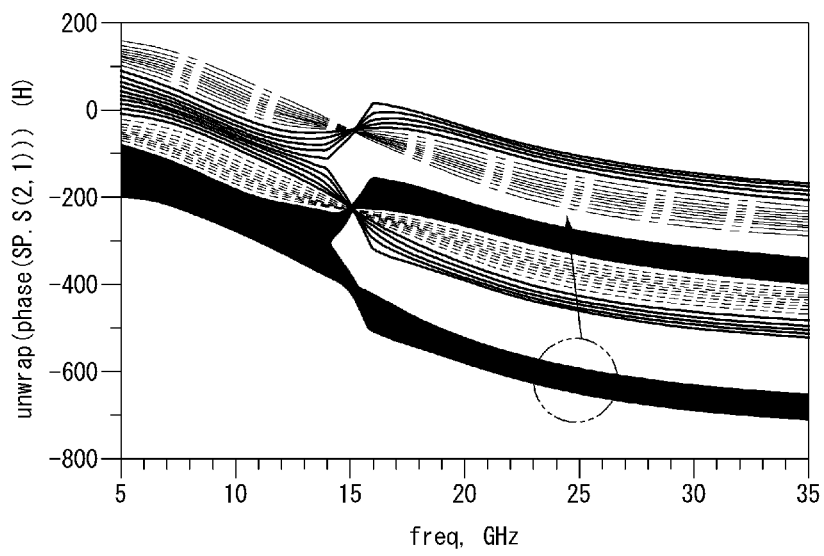
FIG. 14 is a graph illustrating a simulation a result of simulating whether the analog differential adder and a matching circuit is coupled to the phase shifter of the present embodiment including the polyphase filter of FIG. 9 and the phase shifter is shifted to a 360-degree phase.

FIG. 13 is a graph illustrating a result of simulating whether a phase shifter of the comparative example with the existing structure including the analog differential adder and a matching circuit of FIG. 1 is shifted to a 360-degree phase. FIG. 14 is a graph illustrating a simulation a result of simulating whether the analog differential adder and a matching circuit is coupled to the phase shifter of the present embodiment including the polyphase filter of FIG. 9 and the phase shifter is shifted to a 360-degree phase.

As can be seen from the simulation results of the comparative example and the present embodiment of FIGS. 13 and 14, it may be confirmed that 360-degree phase characteristics are maintained in the dual-band phase shifter of the present embodiment.

The operations of the method according to the exemplary embodiment of the present disclosure can be implemented as a computer readable program or code in a computer readable recording medium. The computer readable recording medium may include all kinds of recording apparatus for storing data which can be read by a computer system. Furthermore, the computer readable recording medium may store and execute programs or codes which can be distributed in computer systems connected through a network and read through computers in a distributed manner.

The computer readable recording medium may include a hardware apparatus which is specifically configured to store and execute a program command, such as a ROM, RAM or flash memory. The program command may include not only machine language codes created by a compiler, but also high-level language codes which can be executed by a computer using an interpreter.

Although some aspects of the present disclosure have been described in the context of the apparatus, the aspects may indicate the corresponding descriptions according to the method, and the blocks or apparatus may correspond to the steps of the method or the features of the steps. Similarly, the aspects described in the context of the method may be expressed as the features of the corresponding blocks or items or the corresponding apparatus. Some or all of the steps of the method may be executed by (or using) a hardware apparatus such as a microprocessor, a programmable computer or an electronic circuit. In some embodiments, one or more of the most important steps of the method may be executed by such an apparatus.

In some exemplary embodiments, a programmable logic device such as a field-programmable gate array may be used to perform some or all of functions of the methods described herein. In some exemplary embodiments, the field-programmable gate array may be operated with a microprocessor to perform one of the methods described herein. In general, the methods are preferably performed by a certain hardware device.

The description of the disclosure is merely exemplary in nature and, thus, variations that do not depart from the substance of the disclosure are intended to be within the scope of the disclosure. Such variations are not to be regarded as a departure from the spirit and scope of the disclosure. Thus, it will be understood by those of ordinary skill in the art that various changes in form and details may be made without departing from the spirit and scope as defined by the following claims.

What is claimed is:

1. A dual-band phase shifter comprising:
a first input ($I_p$) configured to commonly connect to a first terminal of a first capacitor (C1), a first terminal of a first inductor (L1), and a first terminal of a first resistor (R1);
a second input ($I_n$) configured to commonly connect to a first terminal of a third inductor (L3), a first terminal of a third capacitor (C3), and a first terminal of a fourth resistor (R4);
a first output ($OI_p$) configured to commonly connect to a second terminal of the first resistor (R1), a second terminal of a second capacitor (C2), and a second terminal of a second inductor (L2);
a second output ($OI_n$) configured to commonly connect to a second terminal of the fourth resistor (R4), a second terminal of a fourth inductor (L4), and a second terminal of a fourth capacitor (C4);
a third output ($OQ_p$) configured to commonly connect to a second terminal of the first capacitor (C1), a second terminal of the third inductor (L3), and a second terminal of a third resistor (R3); and
a fourth output ($OQ_n$) configured to commonly connect to a second terminal of the first inductor (L1), a second terminal of the third capacitor (C3), and a second terminal of a second resistor (R2);
wherein a first terminal of the third resistor (R3) is commonly connected to a first terminal of the second inductor (L2) and a first terminal of the fourth capacitor (C4), and
wherein a first terminal of the second resistor (R2) is commonly connected to a first terminal of the second capacitor (C2) and a first terminal of the fourth inductor (L4).

2. A dual-band phase shifter comprising:
a first input ($I_p$) configured to commonly connect to a first terminal of a series resonance circuit of a first capacitor (C11) and a second inductor (L12), a first terminal of a parallel resonance circuit of a second capacitor (C12) and a first inductor (L11), and a first terminal of a first resistor (R1);
a second input ($I_n$) configured to commonly connect to a first terminal of a series resonance circuit of a fifth capacitor (C31) and a sixth inductor (L32), a first terminal of a parallel resonance circuit of a sixth capacitor (C32) and a fifth inductor (L31), and a first terminal of a fourth resistor (R4);
a first output ($OI_p$) configured to commonly connect to a second terminal of the first resistor (R1), a second terminal of a series resonance circuit of a third capacitor (C21) and a fourth inductor (L22), and a second terminal of a parallel resonance circuit of a fourth capacitor (C22) and a third inductor (L21);
a second output ($OI_n$) configured to commonly connect to a second terminal of the fourth resistor (R4), a second terminal of a parallel resonance circuit of an eighth capacitor (C42) and a seventh inductor (L41), and a second terminal of a series resonance circuit of a seventh capacitor (C41) and an eighth inductor (L42);
a third output ($OQ_p$) configured to commonly connect to a second terminal of the series resonance circuit of the first capacitor (C11) and the second inductor (L12), a second terminal of the parallel resonance circuit of the sixth capacitor (C32) and the fifth inductor (L31), and a second terminal of a third resistor (R3); and a fourth output ($OQ_n$) configured to commonly connect to a second terminal of the parallel resonance circuit of the second capacitor (C12) and the first inductor (L11), a second terminal of the series resonance circuit of the fifth capacitor (C31) and the sixth inductor (L32), and a second terminal of a second resistor (R2);

wherein a first terminal of the third resistor (R3) is commonly connected to a first terminal of the parallel resonance circuit of the fourth capacitor (C22) and the third inductor (L21) and a first terminal of the series resonance circuit of the seventh capacitor (C41) and the eighth inductor (L42), and wherein a first terminal of the second resistor (R2) is commonly connected to a first terminal of the series resonance circuit of the third capacitor (C21) and the fourth inductor (L22) and a first terminal of the parallel resonance circuit of the eighth capacitor (C42) and the seventh inductor (L41).

* * * * *